United States Patent [19]

Shah

[11] Patent Number: 5,614,272

[45] Date of Patent: Mar. 25, 1997

[54] METHOD FOR MAKING SMALL DIMENSIONAL DIAMOND-COATED GRAPHITE ARTICLES

[75] Inventor: Syed I. U. Shah, Wilmington, Del.

[73] Assignee: E. I. Du Pont de Nemours and Company, Wilmington, Del.

[21] Appl. No.: 242,571

[22] Filed: May 13, 1994

Related U.S. Application Data

[63] Continuation-in-part of Ser. No. 978,537, Nov. 19, 1992, abandoned.

[51] Int. Cl.$^6$ .............................. B06B 1/00; C23C 16/26; B05D 3/06
[52] U.S. Cl. ................. 427/560; 427/600; 427/601; 427/577; 427/575; 427/292; 427/299; 427/249
[58] Field of Search ..................... 427/249, 290, 427/292, 299, 560, 575, 577, 600, 601

[56] References Cited

U.S. PATENT DOCUMENTS

| | | |
|---|---|---|
| 4,859,493 | 8/1989 | Lemelson . |
| 4,925,701 | 5/1990 | Jensen et al. ............ 427/600 |
| 4,960,643 | 10/1990 | Lemelson . |
| 5,075,094 | 12/1991 | Morrish et al. . |
| 5,080,975 | 1/1992 | Komaki et al. . |
| 5,082,359 | 1/1992 | Kirkpatrick ............ 427/577 |
| 5,164,051 | 11/1992 | Komaki et al. . |
| 5,308,661 | 5/1994 | Feng et al. ............ 427/249 |
| 5,358,741 | 10/1994 | Gat ........................ 427/249 |

FOREIGN PATENT DOCUMENTS

| | | |
|---|---|---|
| 0500119 | 8/1992 | European Pat. Off. . |
| 1-111707 | 4/1989 | Japan . |
| 4-5964 | 2/1992 | Japan . |
| 4-157157 | 5/1992 | Japan . |
| 677238 | 4/1991 | Switzerland . |

OTHER PUBLICATIONS

Bachman, P.K. et al, *Diamond and Related Materials*, 1, 1–12 (1991).

Angus, J.C. et al, *Proc. 2nd Intern'l. Symp. on Diamond Materials*, The Electrochemical Society, Inc., Pennington, NJ, 91–8, 125–141 (1991).

Johnson, G.H., *Diamond and Diamond–Like Materials Synthesis*, MRS Symposia Proc., EA–15, 99 (1988).

Frenklach, M. *Proc. 2nd Intern'l. Symp. on Diamond Materials*, The Electrochemical Society, Inc., Pennington, NJ, 91–8, 142 (1991)I.

Moorish, A.A. et al, Notice re U.S. Patent Application Serial Number 710,860, filed Jun. 6, 1991 (1991).

Maeda, H. et al, *Journal of Crystal Growth*, 121, 507–515 (1992).

*Primary Examiner*—Roy V. King

[57] ABSTRACT

A process is disclosed for depositing diamond onto a small shaped graphite article by chemical vapor phase deposition, which includes placing the shaped graphite article in a suspension of diamond powder in a liquid, agitating the suspension containing the shaped article, removing the shaped graphite article from the suspension and drying it, and then carrying out the chemical vapor phase deposition of the diamond. Also disclosed are diamond coated shaped graphite articles (e.g., diamond coated graphite fibers having fiber diameters less than about 100 microns).

10 Claims, 6 Drawing Sheets

METHOD FOR MAKING SMALL DIMENSIONAL DIAMOND-COATED GRAPHITE ARTICLES

RELATED APPLICATION

This application is a continuation-in-part of U.S. patent application Ser. No. 07/978,537 filed Nov. 19, 1992 now abandoned.

FIELD OF THE INVENTION

This invention relates to diamond-coated graphite articles and their production using chemical vapor deposition, and more particularly, to diamond deposition suitable for articles having small dimensions.

BACKGROUND OF THE INVENTION

Chemical vapor deposition (CVD) is the method that has been used to deposit diamond thin films. This process involves chemical reaction between two gases or between a volatile compound and gases to produce solid material that deposits atomistically onto a substrate. The various techniques that have been developed to accomplish chemical vapor deposition fall generally into three categories: thermally assisted CVD, plasma assisted CVD and combustion flame diamond deposition. Variations and combinations of these techniques have also been used. The various CVD processes are carried out using a carbon-containing gas such as $CH_4$, $C_2H_2$, acetone, CO and $CO_2$. Typically the carbon-containing gas has been used in a hydrogen mixture with the percentage of hydrogen being 95% or higher. Less-dilute mixtures with hydrogen, mixtures with other gases and pure carbon-containing gas have also been used, see e.g., P. K. Bachman et al., Diamond and Related Materials 1, 1 (1991) for a review of CVD.

Microwave plasma enhanced CVD has proven particularly useful for achieving diamond deposition at relatively low temperatures. In microwave plasma enhanced chemical vapor deposition, glow discharge plasmas are sustained within the chamber where the chemical vapor deposition reactions occur. The presence of the plasma promotes the decomposition of the gas molecules into ions, electrons, atoms and molecules so that reactions occur at lower temperatures when plasma enhanced chemical vapor deposition is used in contrast to the often prohibitively high temperatures required when no plasma is used.

Microwave plasma enhanced CVD of diamond is generally carried out with a mixture of a small amount of a carbon-containing gas such as $CH_4$, $C_2H_2$, CO and $CO_2$ in hydrogen. During the process the carbon-containing gas is decomposed at substrate temperatures of about 700° C. to about 900° C. in the presence of hydrogen to form diamond. Both diamond and graphite phases may deposit simultaneously. It is important to either prevent the graphite from forming or to selectively remove the graphite leaving behind the diamond. This can be accomplished by supersaturating the plasma with atomic hydrogen. Typically, a diluted mixture of about 0.5 to about 2% of $CH_4$ in hydrogen is used.

Diamond nucleation rate is a concern in CVD techniques and various attempts have been made to enhance the nucleation rate. It is well-known that no matter what material is used as the substrate, scratching the surface of the substrate with an abrasive material, particularly diamond powder, greatly enhances the diamond nucleation rate. See, e.g., J. C. Angus et al., Proc. Second Int'l. Symp. on Diamond, The Electrochemical Society, Inc., Pennington, N.J., 91–8, 125 (1991). Typically, this scratching is accomplished by rubbing the surface to be coated with diamond powder or grit. U.S. Pat. No. 5,075,094 illustrates this (and also notes that diamond seems to nucleate strongly on areas of substrates with hydrocarbon contamination). G. H. Johnson et al., Diamond and Diamond-Like Materials Synthesis, MRS Symposia Proc., EA-15, 99 (1988), also disclose that scratching substrates of silicon with various abrasives (particularly diamond powder) greatly enhances the diamond nucleation rate and growth. This publication also discloses that seeding silicon substrates with various hard materials (particularly diamond powder) greatly enhances the diamond nucleation rate and growth. However, the small surface dimensions of articles such as fibers preclude the effective use of conventional rubbing methods. U.S. Pat. No. 5,374,414 to Moorish et al. discloses coating filamentous substrates with diamond by CVD to make diamond or diamond-coated filaments (e.g., diamond tubes or diamond fibers). For high nucleation, substrate filaments are scratched by placing them in an ultrasonic cleaner containing diamond grit.

Another problem which can occur during CVD deposition of diamond onto a shaped article, particularly microwave enhanced CVD, involves substrate deterioration. Atomic hydrogen generated in the microwave plasma is believed to aid diamond growth and selectively removes any graphite that forms. M. Frenklach, Proc. of 2d Int. Symp. on Diamond Materials, Electrochemical Society, Proc. Vol. 91–8, 142 (1991), discusses the preferential etching of graphite over diamond by hydrogen atoms during diamond deposition. Both diamond and graphite are formed simultaneously but graphite is destroyed by reactions with H atoms while diamond is not. The atomic hydrogen also tends to etch the substrate (see, e.g., G. H. Johnson et al., Diamond and Diamond-like Materials Synthesis, MRS Symposia Proc., EA-15, 99 (1988)) and whether this etching becomes a problem depends upon the morphology and material of the substrate as well as the diamond nucleation rate. This etching by hydrogen can be especially troublesome when trying to deposit a diamond coating on a shaped article having small dimensions. Examples of such shaped articles are fibers, cylindrical or spherical particles and powder particles. A graphite substrate is among the most difficult since the atomic hydrogen readily interacts with the graphite to form volatile hydrocarbons which are removed from the surface. As a result a graphite shaped article, for example, a graphite fiber, can be etched away before the diamond coating forms on the surface. In one embodiment, A. A. Moorish et al., U.S. Pat. No. 5,374,414 disclose growing diamond tubes or solid diamond fibers on graphite fibers. Their graphite fibers which normally would be immediately etched away by the atomic hydrogen, are passivated by coating the graphite with a passivating material such as copper, and diamond then is deposited on the copper-coated graphite fibers. As the diamond is deposited on the surface of the copper-coated graphite fibers, the hydrogen simultaneously etches away the graphite, leaving a tubule of diamond with an inner copper coating. J. H. Lemelson, U.S. Pat. No. 4,859,493, discloses a method for forming diamond coatings on fibers, spheroids, etc. in which diamond is deposited on objects which are in free fall, fluidized or tumbling in a vapor or gas of carbon-containing molecules and hydrogen. The use of extra hydrogen to minimize graphite formation is discussed. The problem of graphite etching by hydrogen when the object to be coated is graphite is not addressed. Accordingly, there remains a need for effective methods of CVD deposition of diamond onto articles made of graphite.

SUMMARY OF THE INVENTION

This invention provides a process for the chemical vapor deposition of diamond onto a shaped graphite article, and diamond-coated shaped graphite articles which may be produced by that process. The process comprises the steps of placing the shaped graphite article in a suspension of diamond powder in a liquid (e.g., methanol); agitating this suspension containing the shaped graphite article; and removing the shaped graphite article from the suspension and drying it prior to depositing a diamond coating on the shaped graphite article by chemical vapor deposition. This process provides enhanced diamond nucleation on the article surface during CVD, and is especially useful for the chemical vapor deposition of diamond onto shaped graphite articles having at least two dimensions which are small and/or shaped articles made of materials which are susceptible to etching during CVD (e.g., graphite fibers). This invention provides diamond-coated graphite fibers which have diameters less than about 100 microns.

DETAILED DESCRIPTION

This invention provides a method for enhancing the diamond nucleation rate on the surface of a shaped graphite article during chemical vapor deposition, even when the article has small dimensions; and thereby provides an advantageous process for the chemical vapor deposition of diamond onto such a shaped graphite article. The method for diamond nucleation enhancement of the instant invention comprises agitating the shaped graphite article in a suspension of diamond powder in a liquid. The agitation period for effectively enhancing diamond nucleation on the shaped graphite article provides time sufficient for the surface of the shaped graphite article to become abraded. Simultaneously, diamond powder particles are embedded in the graphite. The shaped graphite article is then dried and a diamond coating is then deposited onto the shaped graphite article by CVD. The steps of placing the shaped graphite article in the suspension, agitating the suspension to abrade the surface of the shaped article and to embed diamond powder particles in the shaped graphite article as well, and drying the shaped graphite article after removing it from the suspension, represent a pre-deposition treatment of shaped graphite articles which can be generally used before diamond deposition to enable the deposition of diamond onto shaped graphite articles by CVD.

The difficulty involved with scratching shaped graphite articles having at least two dimensions that are small by pressing abrasives against them, generally increases as the dimensions become smaller. The method of this invention is especially useful for a shaped graphite article having at least two dimensions less than about 1 mm, and even more useful for a shaped graphite article having at least two dimensions less than about 100 µm (e.g., from 3 µm to 15 µm). The shaped graphite article can be a fiber or a particle with spherical, cylindrical or a less regular shape.

The abrasive powder used for abrading the surface of the shaped graphite article consists essentially of a material harder than graphite. Examples include alumina, silica, silicon carbide, and diamond. Hardness designations for various materials are well known (e.g., the Mohs Hardness Scale). It is believed that the use of any such abrasive powder results in some hardening of the graphite or results in some other change in the graphite thereby lessening the destructive etching of the graphite fiber as well as providing nucleation sites at the scratches. However, the embedded diamond powder particles in the graphite which result from the agitation in a diamond powder suspension are thought to play a major role in enhancing nucleation. Therefore, while the abrading can be carried out with any abrasive material harder than the graphite, a second agitation in a diamond powder suspension would be necessary to embed diamond powder particles in the graphite. Since it is simpler and more economical to have just one agitation, diamond powder is the preferred abrasive powder. The amount of abrasive powder used to make the suspension is from about 0.01 g to about 1 g of abrasive powder per 100 mL of liquid, preferably about 0.1 g of abrasive powder per 100 mL of liquid. The particle size of the abrasive powder is preferably from about 0.25 µm to about 1 µm.

The suspension is formed by dispersing the abrasive powder in a liquid. Water can be used as the liquid as can organic solvents such as the alcohols (e.g., isopropanol, ethanol, methanol). Since the shaped graphite article must be dried after the agitation step, it is convenient to use a liquid which is easily removed, preferably by evaporation. Methanol is a preferred liquid.

The suspension containing the shaped graphite article is agitated for a time sufficient to abrade the surface of the article. Diamond powder particles become embedded in the graphite during the agitation period. As a result, there is enhanced diamond nucleation during diamond deposition on said articles using CVD. As used herein, "enhanced diamond nucleation" is meant to encompass all the beneficial effects regarding diamond growth on the graphite article as a result of agitation using a diamond powder suspension as the resistance to etching of the graphite by atomic hydrogen as well as the improved nucleation of diamond on the graphite as a result of abrading the article surface and embedding diamond powder particles. A convenient method of agitating the suspension is to vibrate it ultrasonically. Typically about 5 to about 60 minutes is sufficient when ultrasonic vibration is used with diamond powder as the abrasive, and the shaped articles are graphite fibers. Preferably, the method of agitation is chosen to provide sufficient impact between the shaped article and the suspended abrasive to efficiently provide the desired surface abrasion and to embed diamond powder particles in the graphite.

The shaped graphite article is removed from the suspension after the surface abrasion, and dried prior to diamond deposition by CVD. Any convenient method for drying can be used, e.g., allowing the liquid of the suspension to evaporate in air, heating the article above the boiling point of the liquid or blotting the shaped article dry with absorbent towels.

For shaped articles made of materials which suffer little or no hydrogen atom or other etching during CVD, the diamond nucleation enhancement provided by the instant process will result in greatly improved, faster growth of the diamond coating on the surface of the article. Silicon carbide is an example of such a material. For shaped articles made of materials which suffer severe hydrogen atom or other etching during CVD, the nucleation enhancement provided by the instant process will make possible the growth of a diamond coating on the surface of articles which might otherwise be completely etched away before the diamond coating forms. Graphite is an example of a material that suffers severe etching and, as a consequence, the process of this invention makes possible the deposition of diamond coatings onto graphite shaped articles including small shaped articles such as graphite fibers without the deposition of a passivating material, such as copper or silicon, on the graphite surface.

The advantages of the instant invention may be further illustrated in connection with a particular microwave plasma enhanced CVD system using a 2.45 GHz source, wherein shaped articles are placed on a heater block in the deposition chamber and heated to a temperature in the range of about 700°–900° C. When using a CVD mixture of about 0.3–5% $CH_4$ in $H_2$ and a discharge chamber pressure of about 10–75 Torr, fibers of graphite and graphite coated with silicon can be etched away completely or in part soon after the ignition of the plasma and before any deposition of diamond occurs. Agitating graphite fibers before CVD in methanol without abrasive powder can result in some improvement in nucleation; but etching of the fibers during CVD still generally results in diamond crystals only on isolated regions of the portions of the fibers which survive the etching. In contrast, graphite fibers pretreated before CVD according to the process of the instant invention by agitation in a suspension of diamond powder in methanol, typically show complete and continuous coating of diamond ranging in thicknesses from about 0.1 μm to about 20 μm, depending on the time of deposition. The coating of diamond may be confirmed using Raman spectra which show a characteristic diamond peak at 1332 $cm^{-1}$. Typically, these Raman spectra contain only slight evidence of the broad band in the range of 1500–1600 $cm^{-1}$ which is characteristic of graphite or other non-diamond carbon, indicating that graphite or other non-diamond carbon is either not present in the coatings produced by the process, or exists in a very small quantity.

This invention includes diamond-coated shaped graphite articles produced by the process of this invention. Diamond is a material which is relatively inert in the presence of many reactive chemicals, which is relatively strong when subjected to various mechanical stresses, and which has a high thermal conductivity. Accordingly, the process of this invention may be used to provide coated articles requiring effective chemical protection, mechanical protection and/or heat dissipation.

This invention includes diamond-coated graphite fibers which have graphite fiber diameters of less than about 100 μm. Diamond-coated graphite fibers with fiber diameters of from 3 to 15 μm are preferred. These fibers can be produced using chemical vapor deposition as described herein. Diamond-coated graphite fibers are considered advantageous materials for use in composites for making products requiring thermal management (e.g., automobile radiators) and/or structural strength (e.g., aircraft, automobile and bridge components).

Practice of the invention will become further apparent from the following non-limiting examples.

EXAMPLE 1

Approximately 100 graphite fibers, 7 μm in diameter and 2 to 3 inches in length were placed in a suspension of 0.1 g of 0.25 μm diamond paste in 100 mL of methanol. The suspension containing the fibers was ultrasonically vibrated for 30 minutes. The fibers were removed from the suspension and blotted dry with absorbent paper towels.

A microwave plasma enhanced ASTEX® CVD system was used for the CVD. This system uses a 2.45 GHz source. The graphite fibers were placed on the heater block in the deposition chamber. The pressure in the chamber was reduced to 1 mTorr by means of a mechanical pump. The fibers were then heated to 850° C. The $H_2$ flow into the chamber was initiated and the plasma ignited. The applied power was 1.5 kW and the reflected power was 1 W. After the plasma stabilized, $CH_4$ was introduced into the chamber and the deposition commenced. Pressure in the chamber was maintained at about 40 Torr (+/−0.05 Torr) during the deposition by a closed loop feedback system. $H_2$ (99.99% pure) and $CH_4$ (99.0% pure) were introduced into the gas manifold through mass flow controllers and the flow rates were maintained at 500 standard cubic centimeter per minute (sccm) for $H_2$ and 3 sccm for $CH_4$ to form a mixture of 0.6% $CH_4$ and 99.4% $H_2$. Deposition continued for 5 hours at which time the flow of $CH_4$ was stopped and the microwave and heater powers were turned off. The fibers were allowed to cool to ambient temperature inside the chamber before they were removed.

Figure 1:
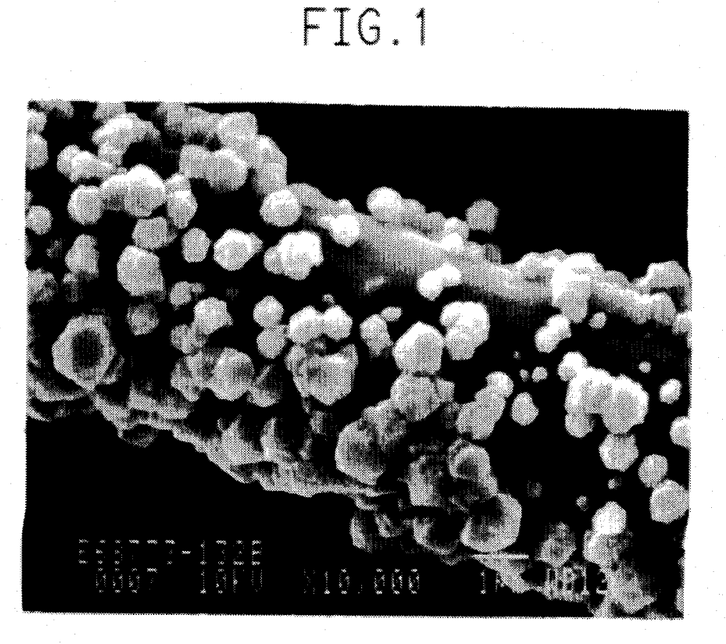
FIG. 1 is a scanning electron micrograph of a diamond-coated graphite fiber prepared in Example 1.

The fibers with the deposited coatings were analyzed by scanning electron microscopy (SEM). FIG. 1 is a scanning electron micrograph which shows a graphite fiber with diamond deposited on it.

EXAMPLE 2

Approximately 100 graphite fibers, 7 μm in diameter and 2 to 3 inches in length were placed in a suspension of 0.1 g of 0.25 μm diamond paste in 100 mL of methanol. The suspension containing the fibers was ultrasonically vibrated for 30 minutes. The fibers were removed from the suspension and blotted dry with absorbent paper towels. The fibers were then coated with diamond following essentially the same CVD procedure used in Example 1 with the exception that the time of deposition was 22 hours instead of 5 hours.

Figure 2:
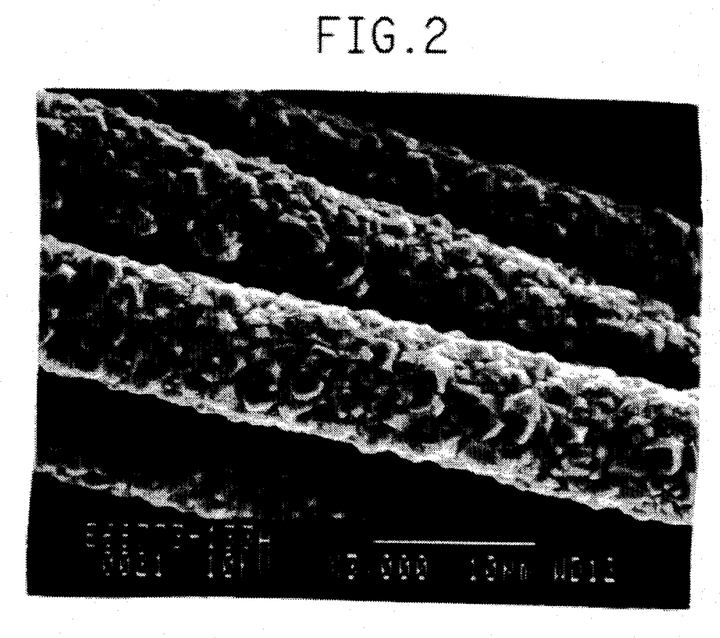
FIG. 2 is a scanning electron micrograph of diamond-coated graphite fibers prepared in Example 2.
Figure 3:
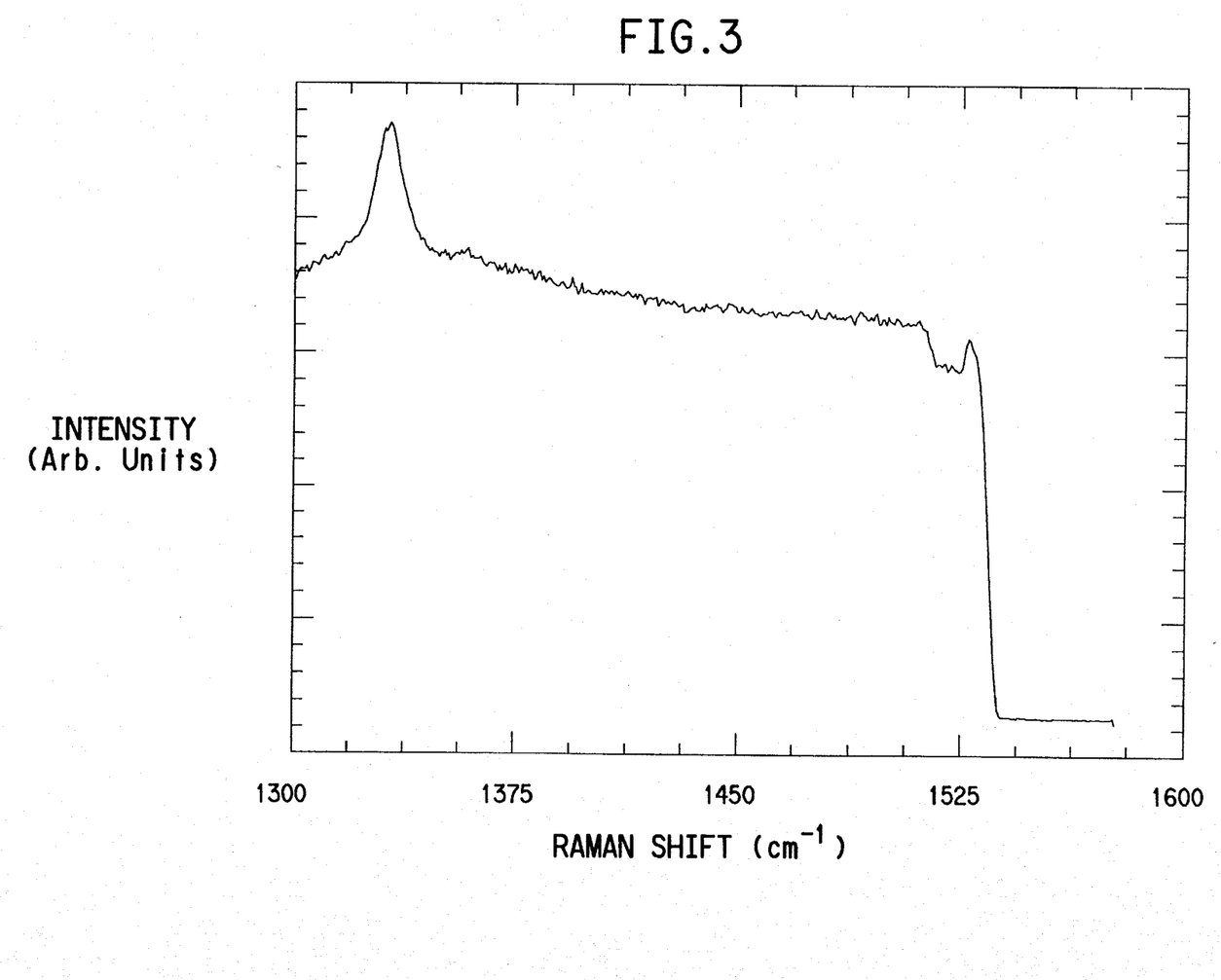
FIG. 3 is the Raman spectrum for one of the diamond-coated graphite fibers prepared in Example 2.

The fibers with the deposited coatings were analyzed by SEM. FIG. 2 is a scanning electron micrograph which shows a complete and continuous coating of diamond on the graphite fibers. FIG. 3 shows the Raman spectrum for one of these fibers. It has the characteristic diamond peak at 1332 $cm^{-1}$.

EXAMPLE 3

Approximately 100 graphite fibers, 7 μm in diameter and 2 to 3 inches in length were placed in a suspension of 0.1 g of 0.25 μm diamond paste in 100 mL of methanol. The suspension containing the fibers was ultrasonically vibrated for 30 minutes. The fibers were removed from the suspension and blotted dry with absorbent paper towels. The fibers were then coated with diamond following essentially the same CVD procedure used in Example 1 with the exception that the reflected power was 2 W instead of 1 W and the time of deposition was 30 hours instead of 5 hours.

Figure 4:
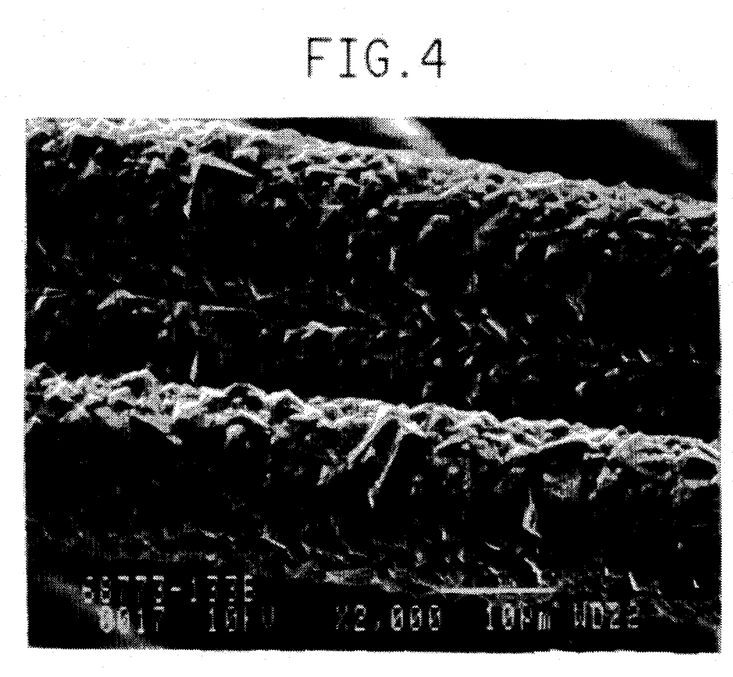
FIG. 4 is a scanning electron micrograph of diamond-coated graphite fibers prepared in Example 3.
Figure 5:
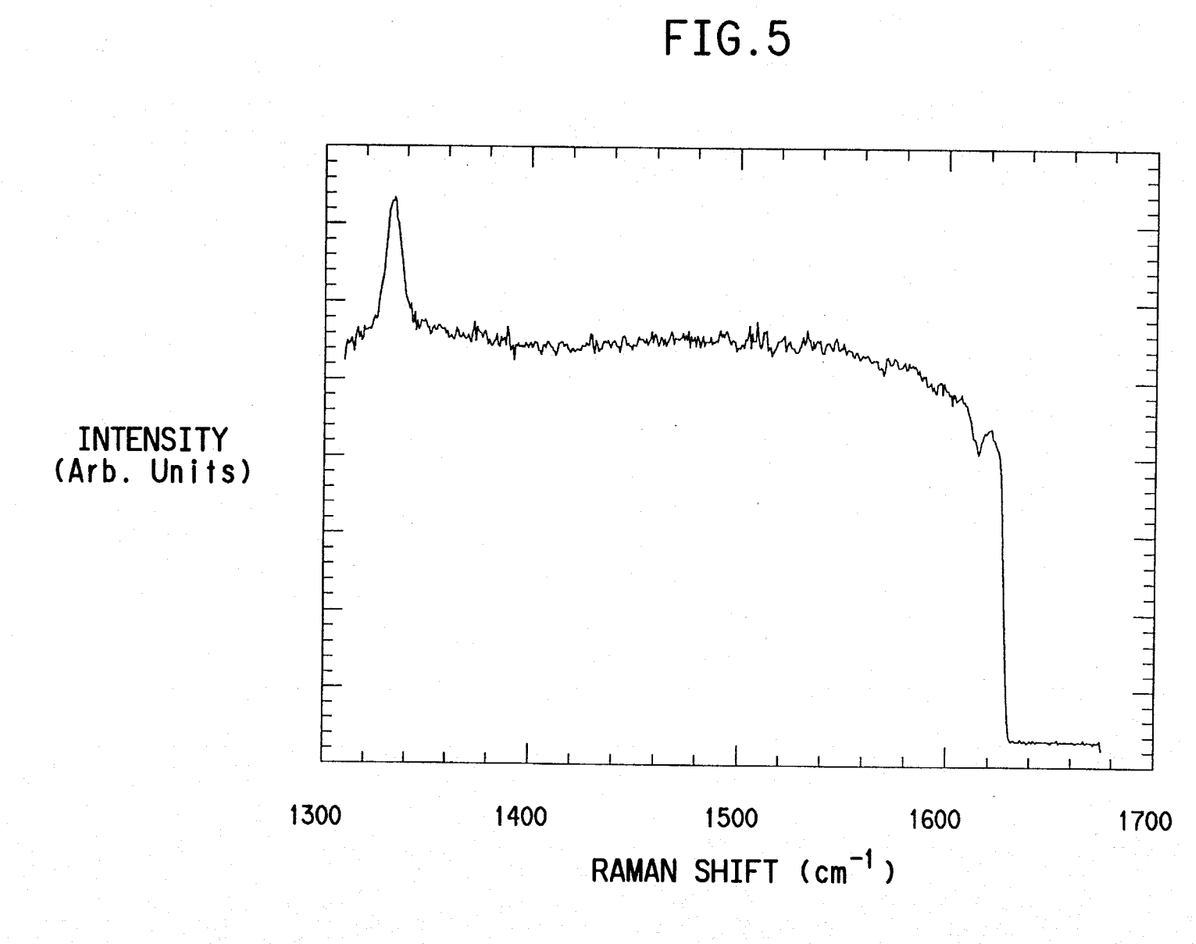
FIG. 5 is the Raman spectrum for one of the diamond-coated graphite fibers prepared in Example 3.

The fibers with the deposited coatings were analyzed by SEM. FIG. 4 is a scanning electron micrograph which shows a complete and continuous coating of diamond on the graphite fibers. FIG. 5 shows the Raman spectrum for one of these fibers. It has the characteristic diamond peak at 1332 cm$^{-1}$.

EXAMPLE 4—COMPARATIVE EXPERIMENT A

Approximately 100 graphite fibers, 7 μm in diameter and 2 to 3 inches in length were placed in a suspension of 0.1 g of 0.25 μm diamond paste in 100 mL of methanol. The suspension containing the fibers was ultrasonically vibrated for 30 minutes. The fibers were removed from the suspension and blotted dry with absorbent paper towels. The fibers (Example 4) were then coated with diamond following essentially the same CVD procedure used in Example 1 with the exception that the reflected power was 2 W instead of 1 W and the time of deposition was 15 hours and 10 minutes instead of 5 hours.

Figure 6:
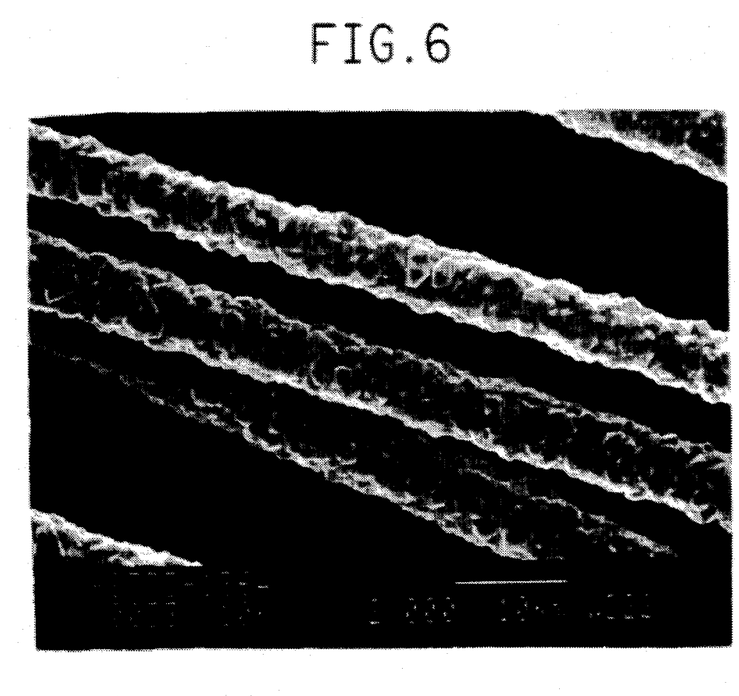
FIG. 6 is a scanning electron micrograph of diamond-coated graphite fibers prepared in Example 4.

The fibers with the deposited coatings were analyzed by SEM. FIG. 6 is a scanning electron micrograph which shows a complete and continuous coating of diamond on the graphite fibers.

For comparison (Comparative Experiment A), approximately 100 other graphite fibers, 7 μm in diameter and 2 to 3 inches in length were placed in 100 mL of methanol which contained no diamond paste or other abrasive powder. The methanol containing the fibers was ultrasonically vibrated for 30 minutes. The fibers were removed from the suspension and blotted dry with absorbent paper towels. An attempt was made to coat these fibers with diamond. The fibeirs were placed in the CVD system and essentially the same CVD procedure used for the other fibers coated in this Example was followed. While the methanol treatment provided some improvement in nucleation, it was not enough to stop the etching. The result was complete etching of most of the fibers. A few surviving portions of fibers show diamond crystals on isolated regions.

COMPARATIVE EXPERIMENT B

An attempt was made to coat approximately 100 graphite fibers, 7 μm in diameter and 2 to 3 inches in length with diamond. The fibers were placed in the CVD system and essentially the same CVD procedure described in Example 1 was followed with the exception that the reflected power was 2 W instead of 1 W, the flow rate was maintained at 5.1 sccm for $CH_4$ to form a mixture of 1.0% $CH_4$ and 99% $H_2$ and the time of deposition was 24 hours instead of 5 hours. The fibers completely etched away.

COMPARATIVE EXPERIMENT C

An attempt was made to coat approximately 100 graphite fibers, 7 μm in diameter and 2 to 3 inches in length with diamond. The fibers were placed in the CVD system and essentially the same CVD procedure used in Comparison B was followed with the exception that the fibers were heated to 700° C. instead of 850° C. and the time of deposition was 40 minutes instead of 24 hours. The fibers completely etched away.

EXAMPLE 5—COMPARATIVE EXPERIMENT D

Figure 7A:
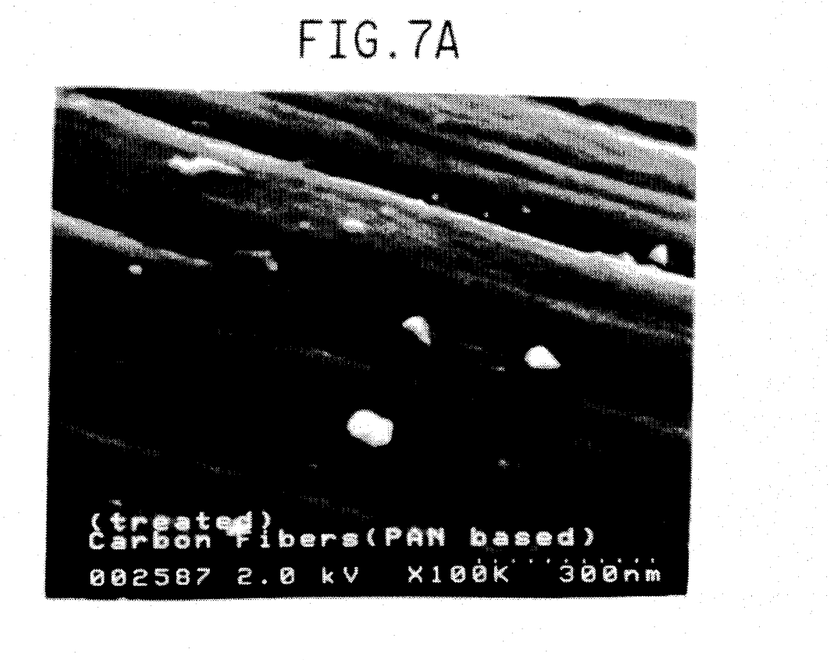
FIG. 7A is a scanning electron micrograph of graphite fibers which were ultrasonically vibrated in a suspension containing diamond powder.
Figure 7B:
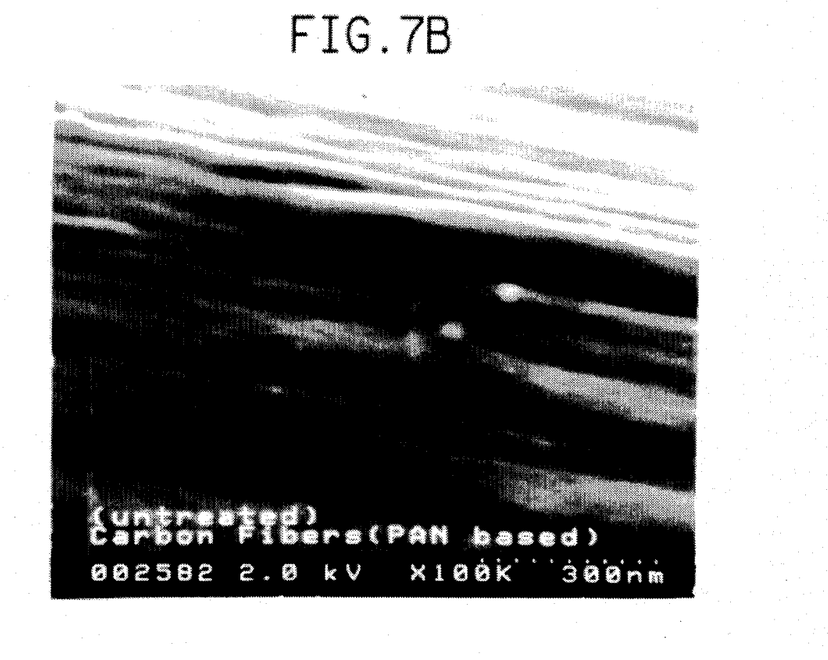
FIG. 7B is a scanning electron micrograph of same graphite fibers which are essentially the same as those in FIG. 7A except that they did not undergo ultrasonic vibration in a suspension containing diamond powder.

Graphite fibers approximately 7 μm in diameter were made by graphitizing polyacrylonitrile—referred to herein as PAN graphite fibers. Some of these fibers were set aside and others were placed in a suspension of 0.1 g of 0.25 μm diamond paste in 100 mL of methanol and ultrasonically vibrated for 30 minutes. The fibers were removed from the suspension and blotted dry with absorbent paper towels. Both sets of fibers, those that were ultrasonically vibrated in the diamond-containing suspension and those that were not, were analyzed by SEM using an Hitachi S-5000 SP microscope. FIG. 7A is a scanning electron micrograph of the fibers that were ultrasonically vibrated and FIG. 7B is a scanning electron micrograph of the fibers that were not ultrasonically vibrated. Diamond particles can be clearly seen on the fibers that were ultrasonically vibrated in the diamond-containing suspension.

Similar results were found for graphite fibers prepared by a different method (i.e., from pitch).

Particular embodiments of the invention are illustrated in the examples. Other embodiments will become apparent to those skilled in the art from a consideration of the specification or practice of the invention disclosed herein. For example, while microwave plasma enhanced CVD was used and the diamond coatings were deposited on graphite fibers for the purposes of demonstrating the advantages of the instant invention, the method of the instant invention will provide diamond nucleation enhancement for any of the CVD techniques and for other shaped graphite article materials as well. It is understood that the invention is not confined to the particular formulations and examples herein illustrated, but it embraces such modified forms thereof as come within the scope of the following claims.

What is claimed is:

1. A process for reducing the etching of shaped graphite articles having at least two dimensions less than about 1 mm, during the chemical vapor deposition of diamond onto said articles, comprising the steps of:

(a) placing a shaped graphite article in a suspension of diamond powder in a liquid;

(b) agitating said suspension containing said shaped graphite article for a time sufficient for the surface of said shaped graphite article to become abraded; and (c) removing said shaped graphite article from said suspension and drying said shaped graphite article prior to depositing diamond onto said dried shaped graphite article by chemical vapor deposition.

2. The process of claim 1 wherein said shaped article has at least two dimensions less than about 100 μm.

3. The process of claim 1 wherein said shaped article has two dimensions from about 3 μm to about 15 μm.

4. The process of claim 1 wherein the particle size of the diamond powder is from about 0.25 μm to 1 μm.

5. The process of claim 4 wherein the agitation step is performed by ultrasonic vibration.

6. The process of claim 5 wherein the suspension contains from about 0.01 g to 1 g of diamond powder per 100 mL of liquid.

7. The process of claim 6 wherein the liquid is methanol.

8. The process of claim 6 wherein said shaped article has two dimensions from about 3 μm to about 15 μm.

9. The process of claim 8 wherein said shaped article is a graphite fiber.

10. The process of claim 9 wherein microwave plasma enhanced chemical vapor deposition is used.

* * * * *